United States Patent
Deng et al.

(10) Patent No.: US 12,196,786 B2
(45) Date of Patent: Jan. 14, 2025

(54) COMPACT FLAT-MOUNT SEGMENTED ROGOWSKI COIL

(71) Applicant: EATON INTELLIGENT POWER LIMITED, Dublin (IE)

(72) Inventors: Zhixi Deng, Coraopolis, PA (US); Santhosh Kumar Chamarajanagar Govinda Nayaka, Moon Township, PA (US); Xin Zhou, Wexford, PA (US); Jianyang Liu, Presto, PA (US); Theodore J. Miller, McDonald, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 117 days.

(21) Appl. No.: 17/994,719

(22) Filed: Nov. 28, 2022

(65) Prior Publication Data

US 2024/0175902 A1    May 30, 2024

(51) Int. Cl.
| | | |
|---|---|---|
| *G01R 15/18* | (2006.01) | |
| *G01R 1/14* | (2006.01) | |
| *G01R 1/20* | (2006.01) | |
| *G01R 1/22* | (2006.01) | |
| *G01R 19/00* | (2006.01) | |

(Continued)

(52) U.S. Cl.
CPC ................. *G01R 15/181* (2013.01)

(58) Field of Classification Search
CPC .... G01R 15/18; G01R 15/181; G01R 15/186; G01R 19/00; G01R 19/12; G01R 19/28; G01R 1/14; G01R 1/20; G01R 1/22
See application file for complete search history.

(56) References Cited

U.S. PATENT DOCUMENTS 9,146,259 B2 *   9/2015   Blake ................... G01R 15/186
9,448,258 B2     9/2016   Garabieta et al.
(Continued)

FOREIGN PATENT DOCUMENTS

WO    2022/149012 A1    7/2022

OTHER PUBLICATIONS

European Patent Office "International Search Report and Written Opinion" for corresponding International (PCT) application No. PCT/EP2023/025500, dated Mar. 7, 2024, 14 pp.

*Primary Examiner* — Neel D Shah
(74) *Attorney, Agent, or Firm* — Eckert Seamans Cherin & Mellott, LLC

(57) ABSTRACT

An improved PCB Rogowski coil addresses the challenges presented by space constraints within circuit interrupters. The disclosed coil comprises a plurality of PCBs that are coupled together, in contrast with known coils constructed from only a single PCB. During a pre-assembly stage, three PCBs are coupled to one another in order to form a partial coil assembly structured to be mounted onto a circuit interrupter primary conductor. After the partial coil assembly is mounted onto the primary conductor, a fourth PCB is connected to the partial coil assembly via press-fit connectors to form a complete coil. In contrast with known PCB Rogowski coils which are structured to be mounted perpendicularly to the primary conductor, the disclosed modular PCB Rogowski coil enables a substantial portion of the PCB surface area to be mounted in parallel to the primary conductor and to thus occupy significantly less space than known PCB Rogowski coils.

10 Claims, 8 Drawing Sheets

(51) Int. Cl.
*G01R 19/12* (2006.01)
*G01R 19/28* (2006.01)

(56) References Cited

U.S. PATENT DOCUMENTS

| | | | |
|---|---|---|---|
| 2009/0066317 A1* | 3/2009 | de Buda | H04B 3/54 |
| | | | 324/141 |
| 2014/0125321 A1 | 5/2014 | Dames | |
| 2023/0058565 A1* | 2/2023 | Gudmundsson | G01R 15/181 |

* cited by examiner

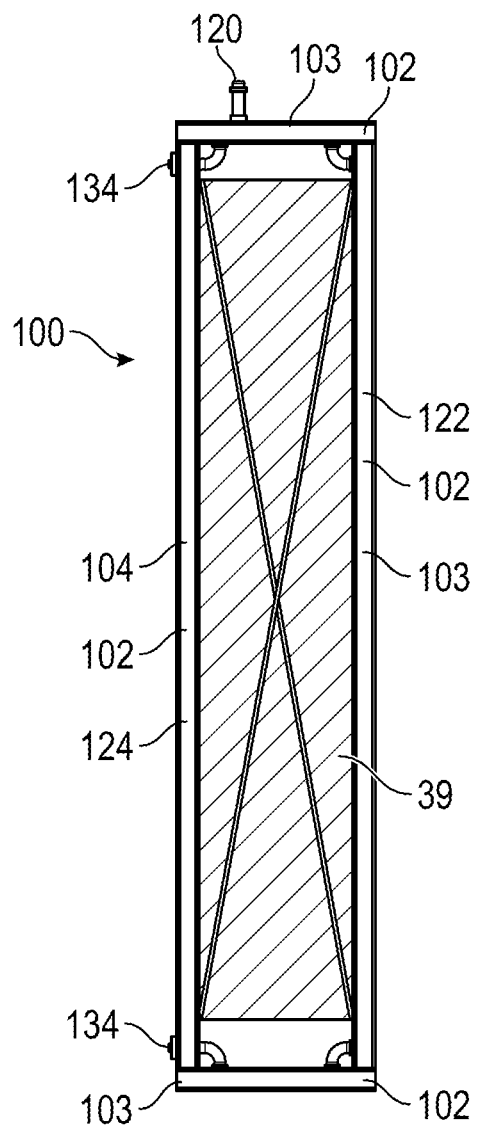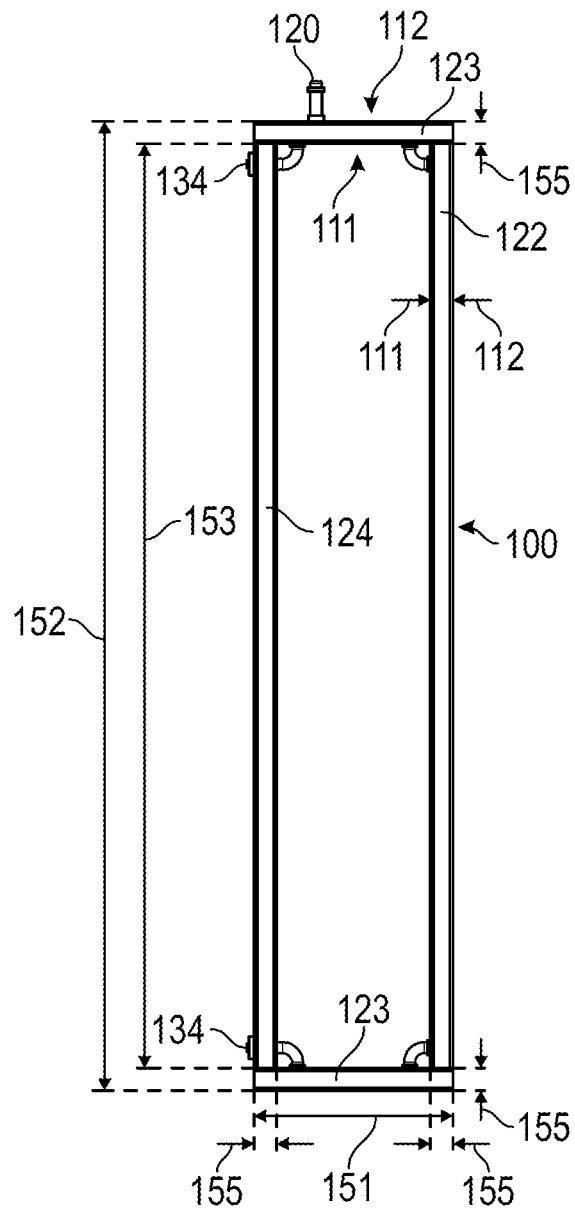
FIG. 9A
FIG. 9B

COMPACT FLAT-MOUNT SEGMENTED ROGOWSKI COIL

FIELD OF THE INVENTION

The disclosed concept relates generally to current sensors, and in particular, to an optimized design for a Rogowski coil used to measure current in circuit interrupters and other current measurement applications.

BACKGROUND OF THE INVENTION

Circuit interrupters, such as for example and without limitation, circuit breakers, are typically used to protect electrical circuitry from damage due to various trip conditions, including an overcurrent condition, such as an overload condition, a short circuit, or another fault condition, such as an arc fault or a ground fault. Referring to FIG. 1, circuit interrupters such as the schematically depicted circuit interrupter 1 are generally structured to be electrically connected between a power source 2 and a load 3 via line and neutral conductors 4, 6. Circuit interrupters typically include separable electrical contacts 8, which operate as a switch. When the separable contacts 8 are in contact with one another in a closed state, current can flow through any circuits connected to the circuit interrupter 1. When the separable contacts 8 are isolated from one another in an open state, current is prevented from flowing through any circuits connected to the circuit interrupter 1. Typically, circuit interrupters include an operating mechanism 10 designed to rapidly open or close the separable contacts 8, and a trip monitoring mechanism, such as an electronic trip unit 12, which uses a current sensor 14 or other type of sensor to detect a number of fault conditions. Upon sensing a fault condition, the trip unit 12 is configured to instruct the operating mechanism 10 to trip open the separable contacts 8.

Rogowski coils are one type of current sensor 14 often used to monitor the AC current flowing through a circuit interrupter 1. A schematic depiction of a traditional Rogowski coil current sensor 14 is shown in FIG. 2. A traditional Rogowski coil is structured as a non-ferromagnetic, generally circular core 15 with a conductive wire 16 wound around the core 15. A first portion 17 of the wire 16 forms a number of turns and is wound around the core 15, and a second portion 18 of the wire 16 is a return portion fed through the interior of the core 15. The return portion 18 of the wire 16 forms a substantially circular shape that lies in a plane.

The Rogowski coil 14 can be used to detect the current flowing through a primary conductor of the circuit interrupter 1, such as, for example and without limitation, the line conductor 4. In order to detect the current flowing through the line conductor 4, the Rogowski coil 14 is positioned so that the line conductor 4 and the flow of current i(t) pass through the center of the coil 14. The end of the first wire portion 17 and the end of the second wire portion 18 are positioned at the same end of the core 15, and form output terminals of the coil 14. The AC current i(t) through the line conductor 4 produces a first voltage signal v(t) across the output terminals. This output voltage signal v(t) is proportional to the rate of change, di/dt, of the current through the line conductor 4. The output terminals of the coil 14 are connected to an integrator and amplifier circuit 20 that produces a second voltage signal V(t), with the second voltage signal V(t) being proportional to the current i(t) through the line conductor 4. Thus, the current through the line conductor 4 can be determined based on the V(t) signal.

The functionality of a Rogowski coil can be generally described as enabling current through a conductor to be indirectly measured by directly measuring and processing a voltage signal induced in a nearby wire, said voltage being induced by the time-varying magnetic field produced by the current through the conductor. It is noted that this general principle can be implemented by Rogowski coils with geometries varying somewhat from that of the traditional coil shown in FIG. 2. In modern circuit interrupters, Rogowski coils are often implemented as printed circuit board (PCB) circuits, with the integration and amplification functions performed by the integrator 20 shown in FIG. 2 usually being performed by an analog circuit, whose output is then sampled by the analog-to-digital converter (ADC) of a microcontroller.

While PCB assemblies (PCBAs) are advantageous in several respects, the task of mounting Rogowski coil PCBAs in circuit interrupters presents a challenge as the space that is available within a circuit interrupter structure is typically very tight (e.g., <5 mm wide). Known Rogowski coil PCBAs typically use a round or oval shaped PCB, which has a significant surface area relative to the conductor whose current flow is being sensed. In addition, for most known Rogowski coil PCBAs used in circuit interrupters, the majority of the PCB surface area is mounted perpendicularly to the primary conductor (e.g. the line conductor 4 shown in FIG. 1). As a result, mounting the round or oval shaped PCB coil perpendicularly uses a significant amount of vertical space and is cumbersome.

There is thus room for improvement in the designs of PCB Rogowski coils used to sense current in circuit interrupters.

SUMMARY OF THE INVENTION

These needs, and others, are met by an improved PCB Rogowski coil assembly disclosed herein that addresses the shortcomings of known Rogowski coil PCBAs. Rather than comprising only a single PCB, the disclosed improved Rogowski coil assembly comprises a plurality of PCBs that are coupled together. During a pre-assembly stage, three PCBs are coupled to one another in order to form a partial coil assembly structured to be mounted onto a primary conductor of a circuit interrupter. After the partial coil assembly is mounted onto the primary conductor of the circuit interrupter, a fourth PCB is connected to the partial coil assembly via press-fit connectors to form a complete Rogowski coil positioned around the primary conductor. In contrast with known Rogowski coil PCBAs which are structured so that a majority of the surface area of the PCBA is mounted perpendicularly to the primary conductor, the modular design of the disclosed PCB Rogowski coil assembly enables majority of the PCB surface area to be mounted in parallel to the primary conductor and to thus occupy significantly less space than known Rogowski coil PCBAs.

In accordance with one aspect of the disclosed concept, a coil assembly for sensing current through a bus bar comprises: a pre-assembled portion constituting less than the entirety of the coil assembly, a removable portion structured to be coupled to the pre-assembled portion, and a plurality of connectors structured to couple the removable portion to the pre-assembled portion. The pre-assembled portion comprises a plurality of PCBs fixedly coupled to one another, with each of the pre-coupled PCBs comprising a first plurality of wire traces. The removable portion comprises a removable PCB comprising a second plurality of wire traces. The coil assembly is structured to be mounted to the bus bar in multiple stages, with the pre-assembled portion being structured to be mounted to the bus bar without the removable portion. The pre-assembled portion and the removable portion are structured such that coupling the removable portion to the pre-assembled portion forms a complete Rogowski coil structured to surround a flow of current through the bus bar, with the Rogowski coil being formed by the first plurality of wire traces and the second plurality of wire traces.

BRIEF DESCRIPTION OF THE DRAWINGS

A full understanding of the invention can be gained from the following description of the preferred embodiments when read in conjunction with the accompanying drawings in which:

FIG. 9A is a reproduction of the sectional view shown in FIG. 5D of the improved PCB Rogowski coil assembly mounted to the load bus bar, with additional reference numbers included; and FIG. 9B is a reproduction of the sectional view of the improved PCB Rogowski coil assembly shown in FIG. 9A with the load bus bar omitted, depicting dimensions of the coil assembly used to determine the mutual inductance between the improved PCB Rogowski coil assembly and a primary conductor of a circuit interrupter, in accordance with an example embodiment of the disclosed concept.

DETAILED DESCRIPTION OF THE INVENTION

Figure 1:
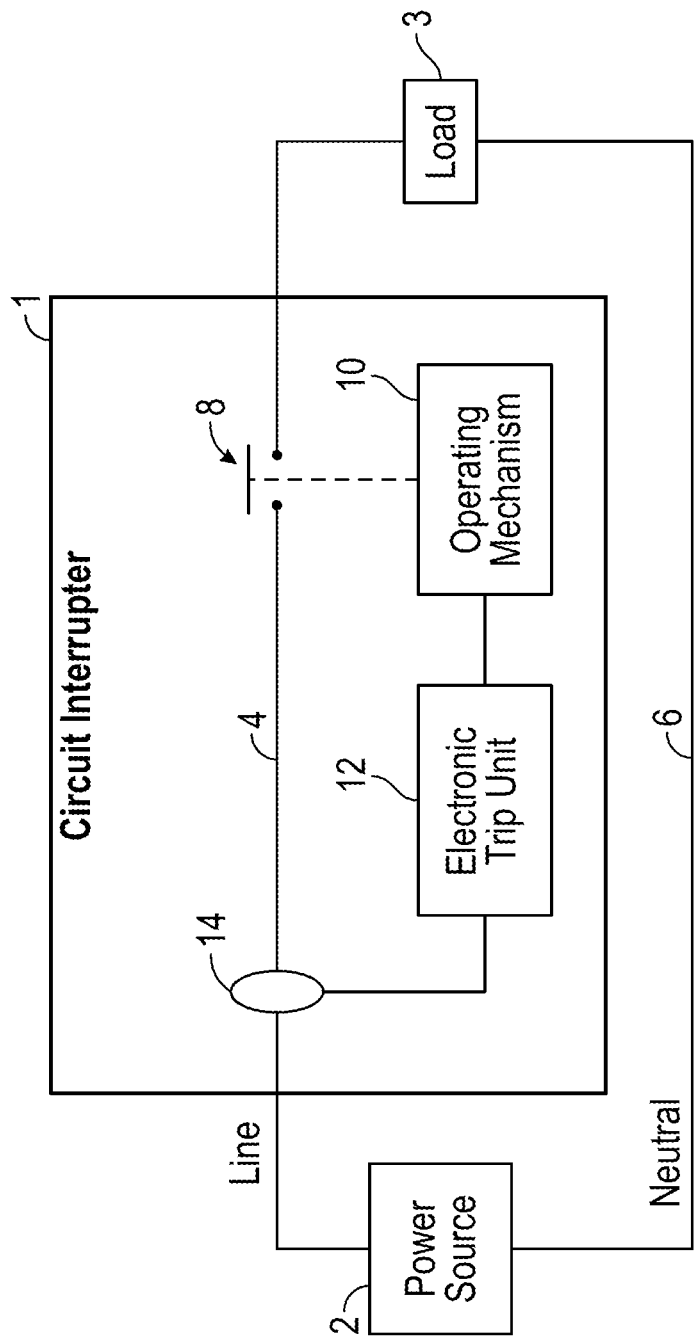
FIG. 1 is a schematic diagram of a circuit interrupter including a current sensor and an electronic trip unit.

Directional phrases used herein, such as, for example, left, right, front, back, top, bottom and derivatives thereof, relate to the orientation of the elements shown in the drawings and are not limiting upon the claims unless expressly recited therein.

As employed herein, the term "controller" shall mean a programmable analog and/or digital device that can store, retrieve and process data; a control circuit; a computer; a workstation; a personal computer; a microprocessor; a microcontroller; a microcomputer; a processor; a central processing unit; a mainframe computer; a mini-computer; a server; a networked processor; or any suitable processing device or apparatus.

As employed herein, the statement that two or more parts are "coupled" together shall mean that the parts are joined together either directly or joined through one or more intermediate parts.

As employed herein, when ordinal terms such as "first" and "second" are used to modify a noun, such use is simply intended to distinguish one item from another, and is not intended to require a sequential order unless specifically stated.

As employed herein, the term "number" shall mean one or an integer greater than one (i.e., a plurality).

An improved PCB Rogowski coil is disclosed herein to address the shortcomings of known PCB-type Rogowski coils used in circuit interrupters. Known PCB Rogowski coils typically comprise a single PCB, which results in a design that occupies a significant volume of vertical space within the circuit interrupter. In contrast, the improved PCB Rogowski coil disclosed herein has a modular design comprising multiple individual PCBs that are coupled together to form the complete Rogowski coil, enabling the fully assembled Rogowski coil to occupy significantly less space.

Figure 3:
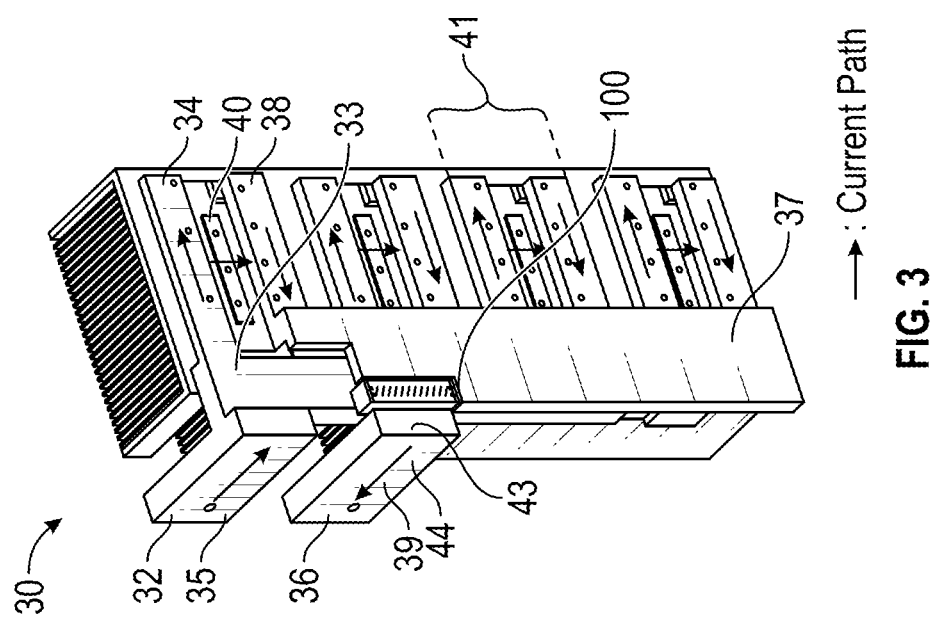
FIG. 3 shows a perspective view of a pole unit in a circuit interrupter, with an improved PCB Rogowski coil assembly installed, in accordance with an example embodiment of the disclosed concept.

In FIG. 3, an improved PCB Rogowski coil assembly 100 according to exemplary embodiments of the disclosed concept is shown. FIG. 3 shows a perspective view of the PCB coil assembly 100 installed in a pole unit 30 of a circuit interrupter, such as the circuit interrupter 1 schematically depicted in FIG. 1. The pole unit 30 comprises a line bus bar 32 (corresponding to the line conductor 4 shown in FIG. 1) and a load bus bar 36 (corresponding to the neutral conductor 6 shown in FIG. 1), with the line bus bar 32 and the load bus bar 36 being structured to be connected to a power source 2 (FIG. 1). The line bus bar 32 comprises a central portion 33 with a plurality of branches 34 extending therefrom, as well as a service input portion 35 adjacent to the central portion 33. The load bus bar 36 similarly comprises a central portion 37 with a plurality of branches 38 extending therefrom, as well as a service return portion 39 adjacent to the central portion 37. The service input portion 35 and the service return portion 39 are structured to facilitate easy connection of the respective line bus bar 32 and load bus bar 36 to the power source 2.

Each line bus branch 34 corresponds to a load bus branch 38, as well as a power electronics module 40 positioned between the line branch 34 and the load branch 38. Each line bus branch 34 and its corresponding load bus branch 38 can be referred to as a branch pair 41, and each branch pair is structured to provide power to a load. When a load is connected to a branch pair 41, power flows from the power source 2 through the line branch 34 to the load, and then returns through the load branch 38 to the power source 2 to complete the circuit.

Figure 4:
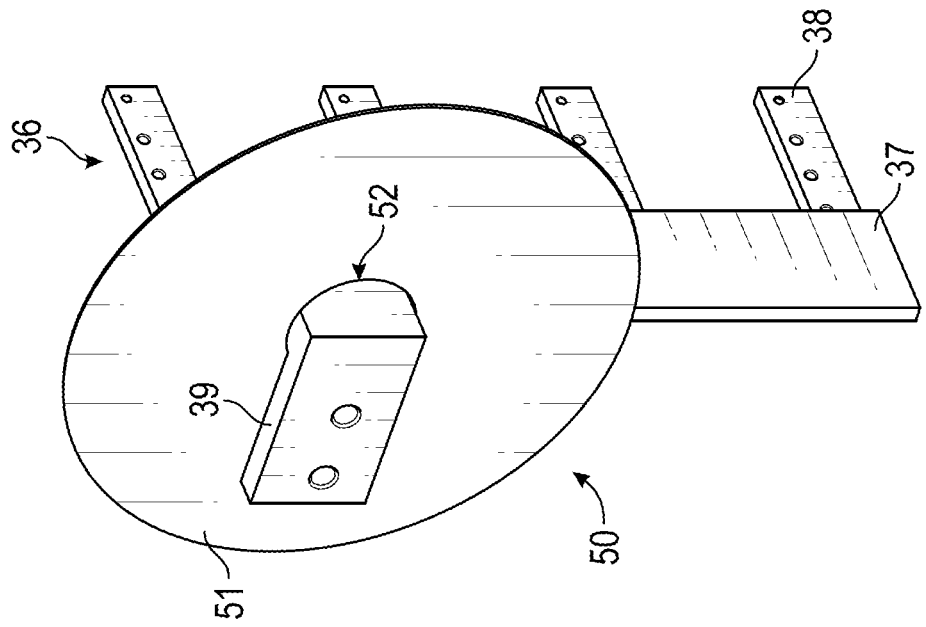
FIG. 4 shows a perspective view of the same pole unit shown in FIG. 3, with a prior art PCB Rogowski coil installed.

FIG. 4 shows a Rogowski coil PCBA 50 representative of known PCB Rogowski coils, mounted on the same load bus bar 36 shown in FIG. 3. Similarly to other typical known PCB Rogowski coils, the Rogowski coil PCBA 50 shown in FIG. 4 comprises a single PCB 51 that is oval or circular in shape, with wire traces formed in the PCB 51 to resemble the general structure of the wire 16 of the traditional Rogowski coil 14 shown in FIG. 2 (the wire traces are not visible in FIG. 4, but are shown and detailed further in conjunction with FIG. 8A). The PCB 51 is formed with a central opening 52 structured to receive the load bus bar service return portion 39 so that the coil PCBA 50 can be mounted on the load bus bar 36, as shown in FIG. 4. The improved PCB coil assembly 100 depicted in FIG. 3 and the known Rogowski coil PCBA 50 depicted in FIG. 4 are designed to have the same maximum achievable sensitivity as one another, i.e. the improved PCB coil assembly 100 has the same mutual inductance with the primary conductor of the circuit interrupter 1 that the known Rogowski coil PCBA 50 has.

The load bus bar 36 is depicted to have approximately the same dimensions in both FIG. 3 and FIG. 4, so the relative dimensions of the improved PCB coil assembly 100 and the known Rogowski coil PCBA 50 having the same maximum achievable sensitivity can be easily compared. An analysis of the dimensions and maximum achievable sensitivity of the improved PCB coil assembly 100 and the known Rogowski coil PCBA 50 is provided later herein in with regard to FIGS. 8A-8B and 9A-9B. In comparing FIG. 4 to FIG. 3, it can be seen that circular coil PCBA design 50 occupies a significant volume of vertical space (vertical relative to the view shown in FIGS. 3 and 4), and the substantial decrease in space occupied by the disclosed improved Rogowski coil assembly 100 compared to a known Rogowski coil PCBA 50 is readily apparent.

Figure 5B:
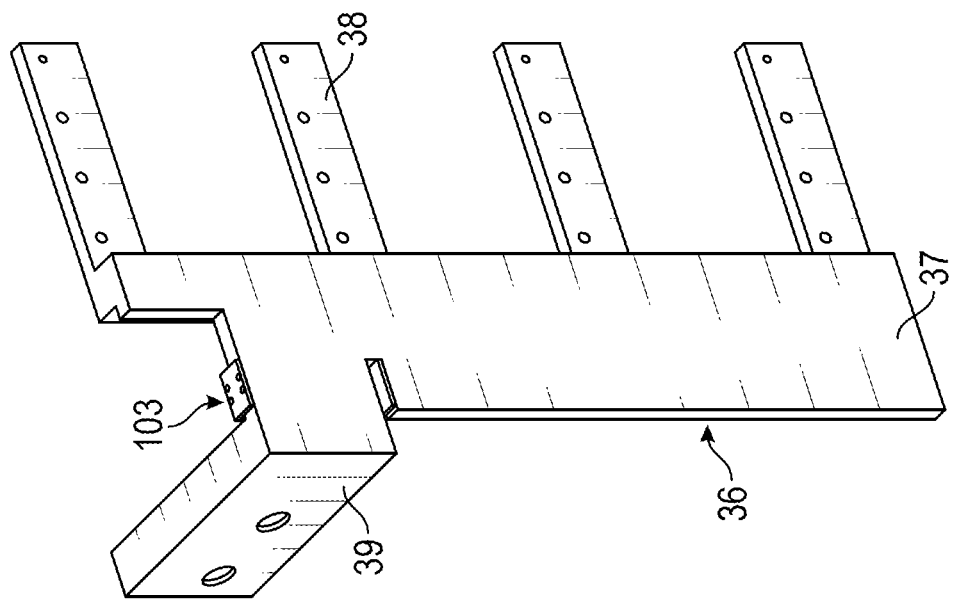
FIG. 5B is a perspective view of the load bus bar shown in FIG. 5A and shows a first stage of mounting and assembling the PCB Rogowski coil assembly to the load bus bar, in accordance with an exemplary embodiment of the disclosed concept.
Figure 5A:
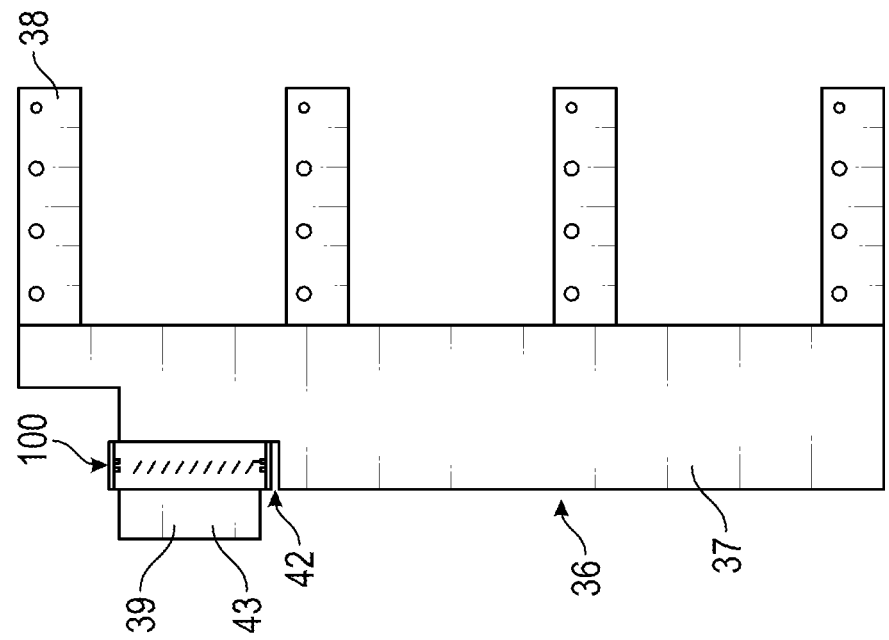
FIG. 5A is an elevation view of the load bus bar and attached PCB Rogowski coil assembly shown in FIG. 3.

FIG. 5A shows an elevation view of the load bus bar 36 of FIG. 3 removed from the service panel 30, with the PCB coil assembly 100 attached, so that the structure of the load bus bar 36 can be seen more easily. When viewing FIG. 5A in conjunction with FIG. 3, it can be seen that the service return portion 39 of the load bus bar 36 extends from the central portion 37, and that the service return portion 39 comprises two sections 43, 44. A notch 42 (numbered only in FIG. 5A) formed in the load bus central portion 37 delineates a first section 43 of the service return portion 39 from the central portion 37. The formation of the notch 42 enables the PCB coil assembly 100 to be easily coupled to the first section 43 of the service return portion 39 in a manner suitable for detecting the current through the load bus bar 36, as detailed further later herein with respect to FIG. 6. The second section 44 (numbered only in FIG. 3) of the service return portion 39 is disposed perpendicularly to the first section 43 and is structured to facilitate easy connection of the load bus bar 36 to the power source 2.

Figure 5D:
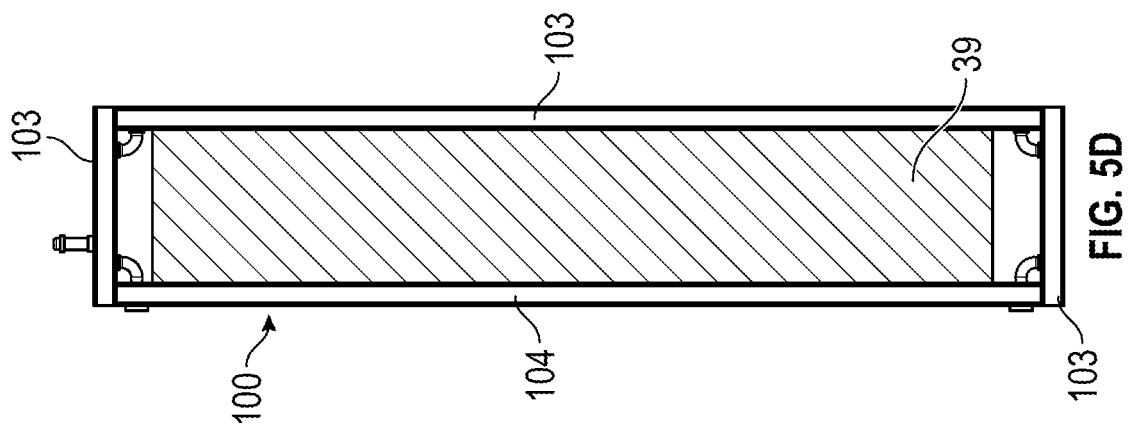
FIG. 5D is a sectional view of the PCB Rogowski coil assembly mounted to the load bus bar, as denoted by the line 5D-5D shown in FIG. 5C.
Figure 5C:
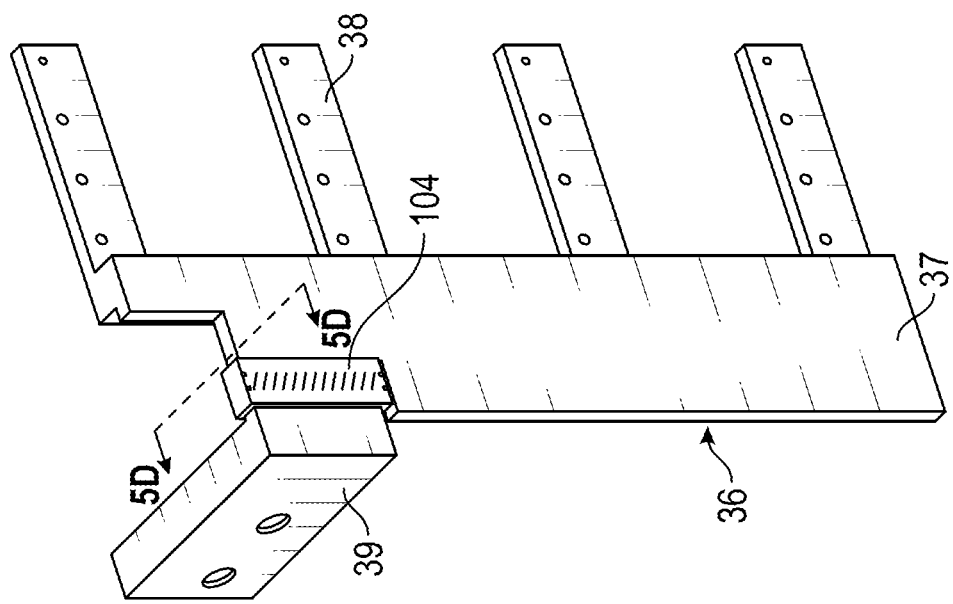
FIG. 5C is the same perspective view of the load bus bar shown in FIG. 5B and shows the second stage of mounting and assembling the PCB Rogowski coil assembly to the load bus bar, in accordance with an exemplary embodiment of the disclosed concept.

Referring now to FIGS. 5B and 5C, it is noted that assembly and mounting of the PCB coil assembly 100 to the electrical service panel 30 takes place in two stages. As detailed further later herein with respect to FIGS. 6 and 7, the PCB Rogowski coil assembly 100 is constructed from a plurality of printed circuit boards (PCBs) 102 coupled to one another using various connectors. FIG. 5B shows the first stage of coupling the PCB coil assembly 100 to the load bus bar 36, wherein a pre-assembled portion 103 of the PCB coil assembly 100 is mounted to the service return portion 39 of the load bus bar 36. The pre-assembled portion 103 comprises fewer than all of the PCBs 102 necessary to complete the PCB coil assembly 100. As detailed further later herein with respect to FIG. 7, an exemplary embodiment of the complete PCB coil assembly 100 comprises four PCBs 102, and the pre-assembled portion 103 comprises three of the four PCBs 102 coupled together.

In FIG. 5C, the second stage of assembling the coil assembly 100 is shown, wherein a removable portion 104 of the PCB coil assembly 100 is coupled to the pre-assembled portion 103 in order to complete the PCB coil assembly 100. FIG. 5D shows a sectional view of the load bus bar service return portion 39 with the fully assembled PCB coil assembly 100 mounted onto it, including the pre-assembled portion 103 and the removable portion 104. It is noted that the load bus bar 36 and pole unit 30 are shown and described herein solely to provide a non-limiting illustrative example of how the improved PCT coil 100 can be mounted within a circuit interrupter 1, and it will be appreciated that the dimensions of the PCT coil assembly 100 can easily be adapted for use with pole units structured differently than the pole unit 30 shown in FIGS. 3 and 5A-5D without departing from the scope of the disclosed concept.

Figure 2:
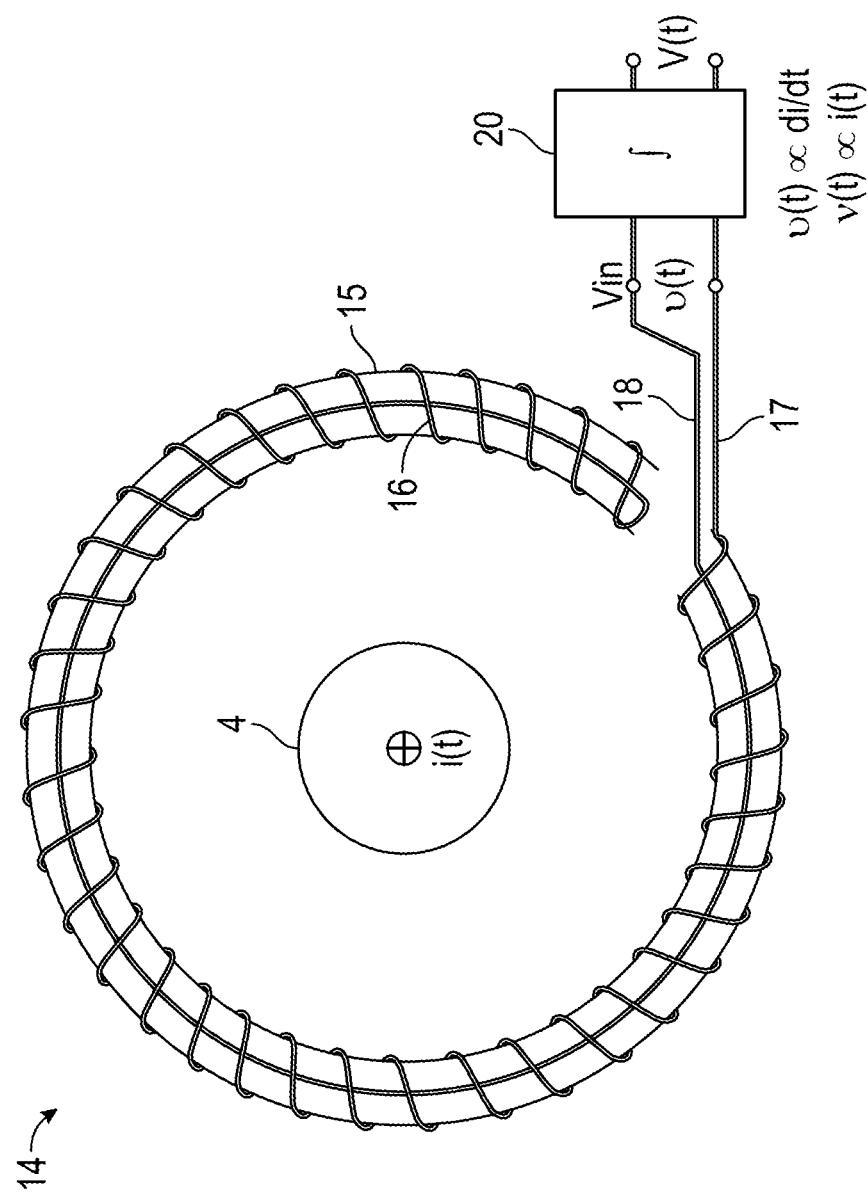
FIG. 2 is a schematic diagram of a traditional Rogowski coil that can be used as a current sensor in a circuit interrupter such as the circuit interrupter schematically depicted in FIG. 1.
Figure 6:
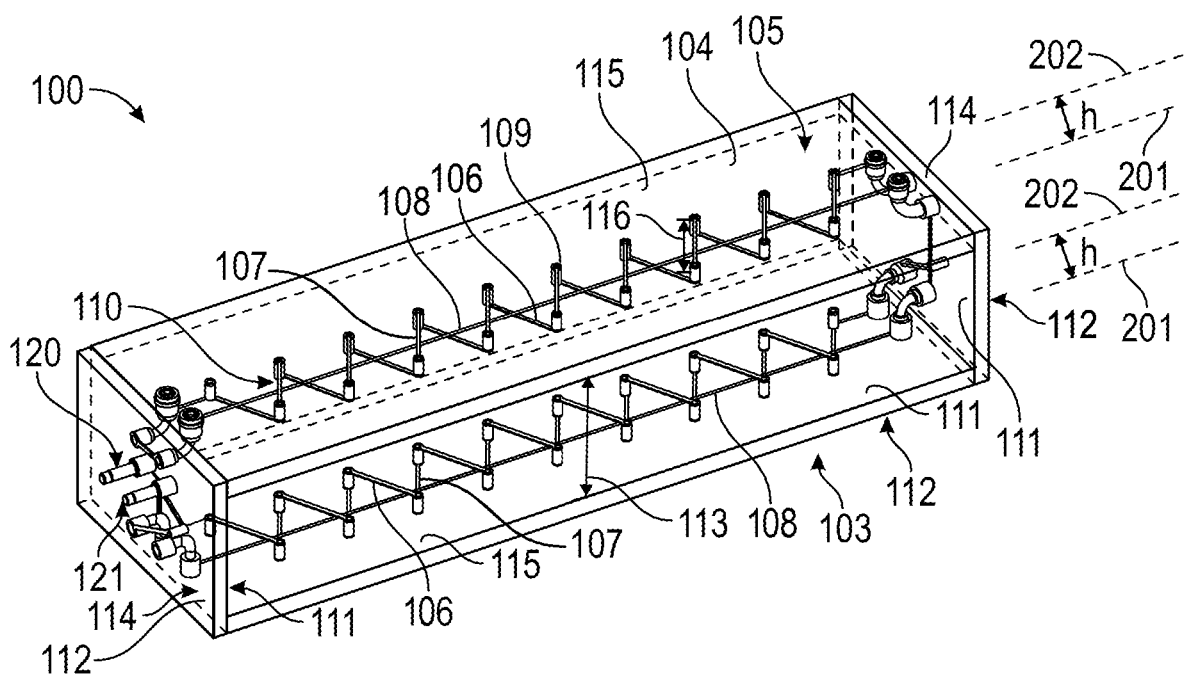
FIG. 6 is a perspective view of the improved PCB Rogowski coil assembly shown in FIGS. 3 and 5A-5D, showing details of conductive wire traces in the printed circuit boards that form a wire trace Rogowski coil, in accordance with an example embodiment of the disclosed concept.
Figure 7:
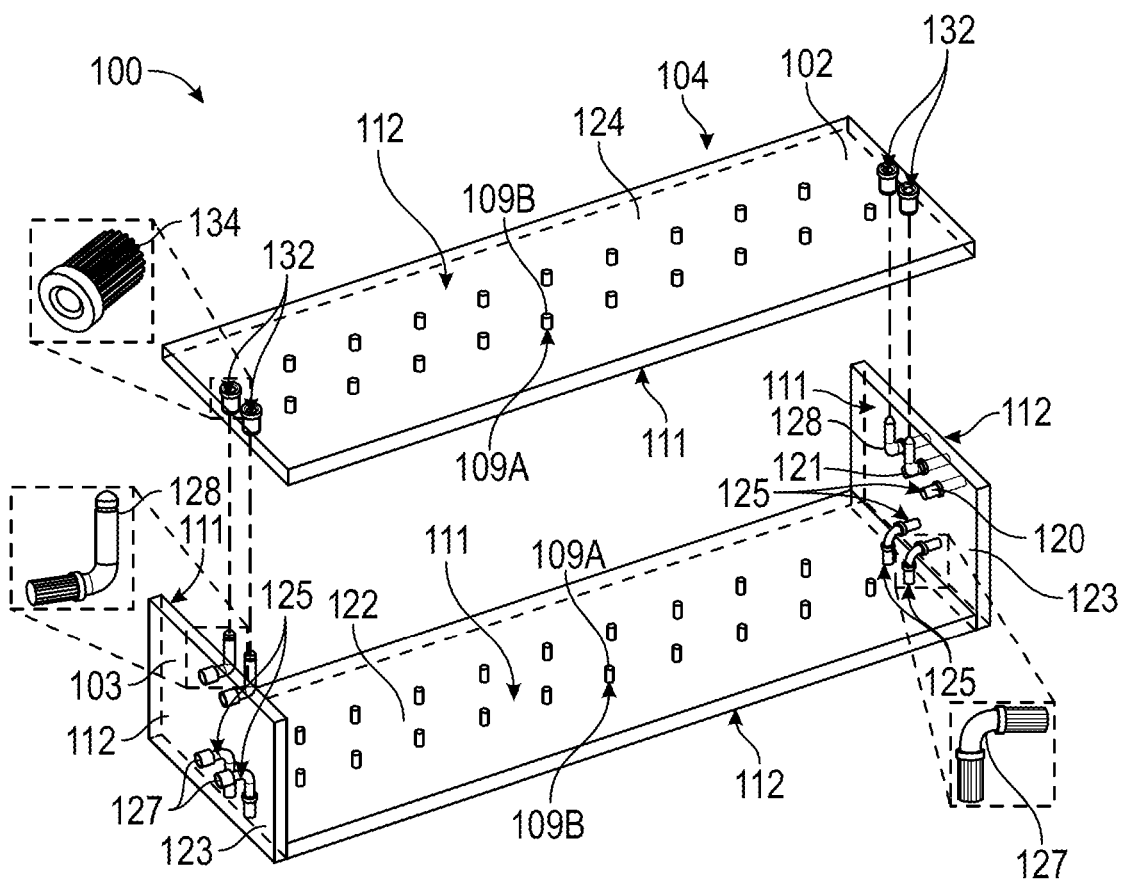
FIG. 7 is an exploded view of the improved PCB Rogowski coil assembly shown in FIG. 6 with the conductive wire traces omitted, showing details of the individual PCBs used to form the fully assembled PCB Rogowski coil assembly and the connectors used to couple the individual PCBs to one another, in accordance with an example embodiment of the disclosed concept.

Referring now to FIG. 6 and FIG. 7, in an exemplary embodiment of the disclosed concept, the PCB coil assembly 100 comprises four rectangular PCBs 102 that are coupled to one another (the individual PCBs 102 being numbered in FIG. 7). It is noted that all of the PCBs 102 are depicted as being semi-transparent in FIGS. 6 and 7, in order to more easily illustrate the features of each PCB 102. Each PCB 102 comprises a non-conductive substrate 105 and is formed with some combination of wire traces 106, 107, 108 and vias 109 (the traces 106, 107, 108 and vias 109 being shown and numbered in FIG. 6). The non-conductive substrate 105 of the PCBs 102 functions similarly to the core 15 of the traditional Rogowski coil 14 (FIG. 2). As shown in FIG. 6, varying combinations of the conductive wire traces 106, 107, 108 and vias 109 are formed in each PCB 102 such that, when all four PCBs 102 are coupled to one another with various connectors (detailed in conjunction with FIG. 7 later herein), the wire traces 106, 107, 108 and vias 109 are positioned in a winding formation that forms a complete wire trace Rogowski coil 110. Referring briefly again to FIG. 3 in conjunction with FIG. 6, it will be appreciated that the improved PCB coil assembly 100 is structured such that, when the assembly 100 is coupled to the load bus bar 36, the current through the load bus bar 36 flows through the loop formed by the wire trace Rogowski coil 110.

Each PCB 102 has an interior surface 111 that faces the load bus bar 36 when the PCB coil assembly 100 is mounted onto the load bus bar 36, and an exterior surface 112 disposed opposite the interior surface 111 that faces away from the load bus bar 36 when the PCB coil assembly 100 is mounted onto the load bus bar 36. It should be noted that each via 109 extends from the interior surface 111 to the exterior surface 112 of its respective PCB 102, which may be best understood by viewing FIG. 7. As labeled in FIG. 7, for any given via 109 included in a given PCB 102, a first end 109A of the via 109 is disposed on the interior surface 111 of the PCB 102, and a second end 109B of the via 109 is disposed on the exterior surface 112 of the via's respective PCB 102. The first end 109A of a via 109 can alternatively be referred to as an interior end 109A, and the second end 109B of a via 109 can alternatively be referred to as an exterior end 109B.

As labeled in FIG. 6, there is a gap 113 that separates the interior surfaces 111 of all four PCBs 102 from one another when the coil assembly 100 is fully assembled, and said gap 113 may be easier to ascertain by viewing FIG. 7 in conjunction with FIG. 6. The space between the interior surfaces 111 can be referred to as the "interior" of the PCB coil assembly 100, and all other space not within the interior of the coil assembly 100 can be referred to as the "exterior" of the coil assembly 100. A first group 106 of the wire traces are inner traces that are formed on the interior surface 111 of the PCBs 102, a second group 107 of the wire traces are outer traces that are formed on the exterior surface 112 of the PCBs 102, and a third group 108 of the wire traces are mid layer traces formed in a middle layer of the PCBs 102 between the interior surface 111 and the exterior surface 112. Each inner trace 106 extends between the interior end 109A of one via 109 and the interior end 109A of another via 109, while each outer trace 107 extends between the exterior end 109B of one via 109 and the exterior end 109B of another via 109.

The shape of the fully assembled PCB coil assembly 100 in the exemplary embodiment shown in FIG. 6 is referred to herein as an open rectangular prism. The open rectangular prism is characterized as comprising four total sides (each side being an individual rectangular PCB 102), the four sides forming two parallel PCB pairs 114 and 115, such that each PCB 102 in a given pair 114, 115 is disposed parallel to the other PCB 102 in the given pair 114, 115. In addition, each PCB 102 from a given one of the pairs 114 or 115 is adjacent and perpendicular to both PCBs 102 in the other pair 115 or 114. This configuration results in the interior surface 111 of each PCB 102 in the pair 114 facing the interior surface 111 of the other PCB 102 in the pair 114, and in the interior surface 111 of each PCB 102 in the pair 115 facing the interior surface 111 of the other PCB 102 in the pair 115.

The inner and outer traces 106, 107 form the turns of the wire trace Rogowski coil 110, similarly to the first portion 17 of the traditional Rogowski coil wire 16 (FIG. 2). The inner and outer traces 106, 107 are electrically connected to the vias 109 and to one another by the vias 109. The mid layer traces 108 form a return portion that is fed through the interior of the coil turns 106, 107, similarly to how the second portion 18 of the traditional Rogowski coil wire 16 is fed through the first portion 17 (FIG. 2). For each given PCB 102 that includes vias 109, the vias 109 are formed in two rows 201 and 202 (numbered in FIG. 6) within the PCB 102, with the two rows 201 and 202 being parallel to one another and parallel to two of the sides of the rectangular PCB 102. For each given individual wire trace 106 or 107, the wire trace 106 or 107 extends between a via 109 in row 201 and a via 109 in row 202, and the length of that given trace is considered to be the distance 116 between the via 109 in row 201 and the via 109 in row 202.

One of the PCBs 102 is designated to include an electrical start lead 120 and an electrical end lead 121. The start lead 120 is electrically connected to the inner and outer traces 106, 107 and is used to form the start of the turns portion of the wire trace coil 110. The end lead 121 is electrically connected to the mid layer traces 108 and is used to terminate the return portion of the wire trace coil 110. The start and end leads 120, 121 extend outward from the PCB exterior surface 112 to the exterior of the coil assembly 100 so that a microcontroller or other suitable signal processing means can be connected to the leads 120, 121, in order to receive and process the voltage signal produced by the coil 110 and produce a measurement of the current through the load bus bar 36. For example and without limitation, it may be necessary to perform integration and/or amplification of the signal attained at the start and end leads 120, 121.

In the exemplary embodiment of the PCB coil 110 shown in FIGS. 6 and 7, one of the PCBs 102 used to construct the pre-assembled portion is a long board 122 (numbered in FIG. 7), and two of the PCBs 102 used to construct the pre-assembled portion 103 are short boards 123 (numbered in FIG. 7). The long board 122 has a greater length than the two short boards 123, and the two short boards 123 have equivalent dimensions relative to one another. Another long board 124 is used as the removable portion 104 of the coil 110, and the long board 124 has the same dimensions as the long board 122 of the pre-assembled portion 103. FIG. 7 shows details of the connectors used to couple the PCBs 102 to one another in an exemplary embodiment. It is noted that the relative dimensions of the long boards 122, 124 and the short boards 123 shown in the figures are not intended to be limiting. Rather, the relative dimensions shown in the figures are depicted to optimize the space available in the pole unit 30 depicted in FIG. 3, but it will be appreciated that PCBs of other relative dimensions can be used to appropriately reflect the space available in differently designed pole units without departing from the scope of the disclosed concept.

Still referring to FIG. 7, all of the PCBs 102 used to construct the pre-assembled portion 103 of the coil assembly 100 are formed with apertures 125 structured to receive press-fit connectors 127, 128. In addition, the PCB 102 used as the removable portion 104 of the coil 110 is formed with apertures 132 structured to receive snug-fit caps 134. It is noted that FIG. 7 denotes the coil assembly 100 being rotated 180 degrees from the position of the coil assembly 100 shown in FIG. 6, such that the start lead 120 and end lead 121 are shown on the righthand side of FIG. 7. As denoted in FIG. 7, the start lead 120 and end lead 121 include press-fit connection ends suitable for insertion into the press-fit apertures 125.

Continuing to refer to FIG. 7, connectors 127 having two press-fit ends are used to couple the long board 122 and short boards 123 together in order to form the pre-assembled portion 103 of the coil assembly 100, while connectors 128 having one press-fit end and one snug-fit end are used to couple the removable portion long board 124 to each of the two short boards 123. After the press-fit ends of the connectors 127, 128 are inserted into the apertures 125 of the pre-assembled portion PCBs 102, the press-fit connections are soldered. Prior to the second stage of assembling the PCB coil assembly 100 shown in FIG. 5C, snug-fit caps 134 are inserted into the snug-fit apertures 132 of the removable portion long board 124.

In order to couple the removable portion 104 of the coil assembly 100 to the pre-assembled portion 103, the removable portion 104 is first positioned so that the snug-fit caps 134 inserted into the snug-fit apertures 132 align with the snug-fit ends of the connectors 128 coupled to the short boards 123. Pressure can then be applied to the exterior surfaces 112 of the long boards 122, 124 to facilitate insertion of the connector 128 snug fit-ends into the snug-fit caps 134 in order to securely couple the removable portion 104 to the pre-assembled portion 103. The press-fit and snug-fit connectors 127, 128 and snug-fit caps 134 are used in an exemplary embodiment for their low cost and ease of use, however, it will be appreciated that there are several other types of connectors suitable for coupling the PCBs 102 to one another. It is noted that any suitable mechanism can be used to couple the PCBs 102 to one another without departing from the scope of the disclosed concept.

The unique flat mount design of the improved PCB coil assembly 100 enables the coil windings (i.e. the traces 106, 107) of the wire trace coil 110 to more effectively capture the magnetic field created around the primary conductor of a circuit interrupter 1 than the wire traces of known PCBA Rogowski coils do. A comparison of the dimensions of the improved PCB coil assembly 100 and the known Rogowski coil PCBA 50 (FIG. 4) is presented later herein using Table 1 in order to demonstrate the advantages of the improved PCB coil assembly 100 over known PCB Rogowski coils. In order to make the differences between the disclosed improved PCB coil assembly 100 and the prior art Rogowski coil PCBA 50 readily apparent, the comparison is based on both assemblies using printed circuit boards with a standard thickness of 1.57 millimeters, and on both assemblies having the same maximum achievable sensitivity of $0.88 \times 10^{-7}$ H, with "sensitivity" denoting the mutual inductance between the wire trace coil of the improved assembly 100 or prior art PCBA 50 and a circuit interrupter primary conductor. For example, with regard to the disclosed improved PCB coil assembly 100, sensitivity refers to the mutual inductance of the wire trace coil 110 with a circuit interrupter primary conductor.

Table 1 shows various parametric specifications that a prior art Rogowski coil PCBA (such as known coil PCBA 50) would need to meet alongside the comparable parametric specifications that the improved PCB coil assembly 100 would need to meet in order to achieve the same sensitivity of $0.88 \times 10^{-7}$ H (the maximum achievable sensitivity is denoted as Rogowski mutual inductance (M) in Table 1). An explanation of the parameters listed in Table 1 follows the table. The Table 1 parameters are explained in conjunction with FIGS. 8A-8B, which depict the parameters for the prior art coil PCBA design 50, and FIGS. 9A-9B, which depict the parameters for the disclosed improved PCB coil assembly design 100. The calculation of the maximum achievable sensitivity of the prior art coil PCBA 50 is explained later herein in conjunction with Equations (1) and (2), while the calculation of the maximum achievable sensitivity of the improved PCB coil assembly 100 is explained later herein in conjunction with Equations (3) and (4).

Figure 8A:
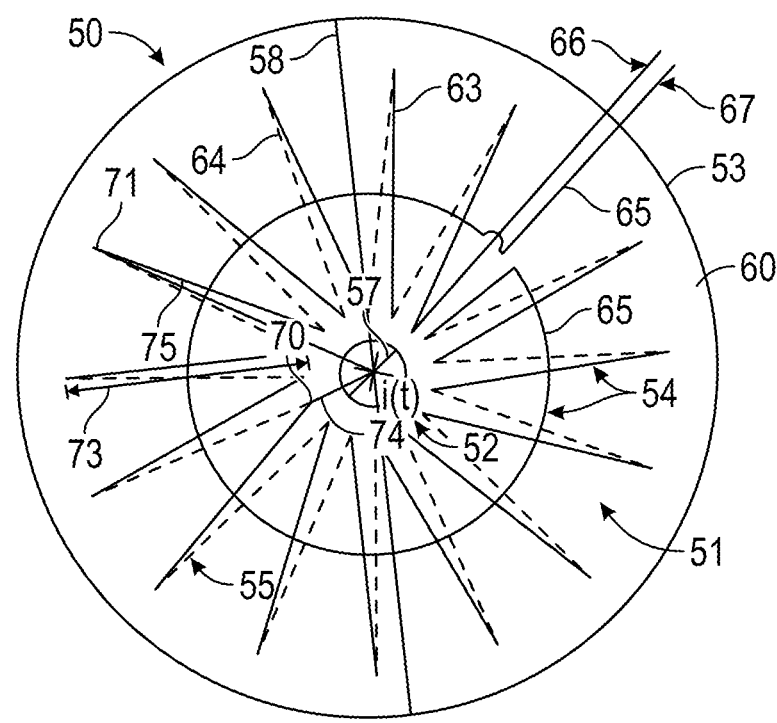
FIG. 8A is a symbolic representation of the dimensions of the prior art Rogowski coil PCBA shown in FIG. 4, which are used to determine the mutual inductance between the prior art coil PCBA and a primary conductor of a circuit interrupter.
Figure 8B:
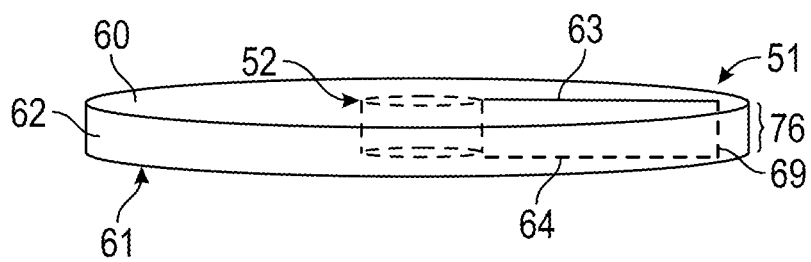
FIG. 8B is a partial isometric view of the printed circuit board of the coil PCBA shown in FIG. 8, showing the various surfaces of the printed circuit board.

Prior to detailing the parameters of Table 1 in conjunction with the prior art coil PCBA design 50, a few details regarding the prior art coil PCBA design 50 shown in FIGS. 8A-8B should be noted. FIG. 8A is an elevation view of one surface of the PCBA design 50 that shows the Rogowski coil formed by wire traces formed in the PCB 51, and FIG. 8B is a perspective view provided to better show all surfaces of the PCB 51. It is noted that FIG. 8A depicts fewer wire traces and turns of the Rogowski coil than a coil PCBA would typically have, in order to avoid cluttering the figure. It is also noted that FIG. 8B only shows two wire traces rather than the entire wire trace coil of the PCBA design 50, in order to more clearly show certain features of the PCB 51. It is further noted that the dimensions of the PCB 51 as depicted in FIG. 8B are not to scale, since for the coil PCBA 50 portrayed in Table 1, the diameter of the circular surface areas of the PCB 51 is over 250 times greater than the thickness of the PCB 51.

As previously mentioned in conjunction with FIG. 4 and as shown in FIGS. 8A-8B, the PCB 51 of the prior art coil PCBA 50 comprises a central opening 52 structured to receive the conductor whose current i(t) is to be sensed, e.g. the service return portion 39 of the load bus bar 36 (FIG. 4). The current i(t) denoted in FIG. 8A corresponds the current through the load bus bar 36 (FIG. 4). The PCB 51 further comprises a circumference 53 and is formed with wire traces 54 that form a Rogowski coil 55. The PCB 51 is further defined by an inner diameter 57 and an outer diameter 58, with the inner diameter 57 being the diameter of the central opening 52 and the outer diameter 58 being the diameter measured in relation to the circumference 53. As shown in FIG. 8B, the PCB 51 comprises a first circular surface 60, and a second circular surface 61, and a cylindrical section 62 that extends from the first circular surface 60 to the second circular surface 61. The surface shown in FIG. 8A is the first circular surface 60.

Continuing to refer to FIGS. 8A-8B, there are three groups of the wire traces 54 shown in FIG. 8A: a first group 63 that is formed on the first circular surface 60, a second group 64 (denoted in dashed line) that is formed on the second circular surface 61, and a third group 65 (shown only in FIG. 8A) formed in the cylindrical section 62 such that the third group 65 is formed in a middle layer of the PCB 51 disposed between the first and second circular surfaces 60, 61. The first group 63 and second group 64 of wire traces form the turns of the Rogowski coil. The third group 65 of wire traces forms the return portion of the Rogowski coil, as well a start lead 66 and an end lead 67 that are used to connect to an integrator and/or amplifier circuit. A wire trace from one group can be connected to a wire trace from another group using vias 69 (labeled in FIG. 8B) formed in the cylindrical section 62, or other structures suitable for electrically connecting wire traces. As labeled in FIG. 8A, the Rogowski coil comprises inner points 70 that are the points positioned closest to the current flow i(t), and outer points 71 that are the points positioned furthest away from the current flow i(t). For each given individual wire trace 63 or 64, the length of that given trace considered to be the distance 73 between the inner point 70 and the outer point 71 corresponding to that given trace.

TABLE 1

| Symbol | Parameter | Prior Art Coil Design | Disclosed Improved Coil Assembly Design |
|---|---|---|---|
| D | Dimension | Inner diameter = 61 mm<br>Outer diameter = 451.41 mm | Width = 13.22 mm<br>Height = 64.02 mm |
| i | Inner trace distance from center | 61.5 mm | N/A |
| o | Outer trace distance from center | 137.28 mm | N/A |

TABLE 1-continued

| Symbol | Parameter | Prior Art Coil Design | Disclosed Improved Coil Assembly Design |
|---|---|---|---|
| A | Cross-sectional area of the space between the winding traces | N/A | 28.5 mm² |
| l | Total path length around the loop | N/A | 154.48 mm |
| N | Maximum number of turns | 349 | 380 |
| h | Trace maximum depth | 1.57 mm | 18.15 mm |
| t | PCB thickness | 1.57 mm | 1.57 mm |
| M | Rogowski mutual inductance | 0.88 × 10⁻⁷ H | 0.88 × 10⁻⁷ H |

An explanation of the parameters listed in Table 1 for the prior art coil PCBA design 50 will now be provided in conjunction with FIGS. 8A-8B. The dimension parameter (D) refers to the inner diameter 57 and outer diameter 58 of the PCB 51 (FIG. 8A). The inner trace distance from center (i) parameter refers to the distance 74 between the inner points 70 and the current flow i(t). The outer trace distance from center (o) parameter refers to the distance 75 between the outer points 71 and the current flow i(t). The PCB has a thickness 76 (labeled in FIG. 8B) of 1.57 mm. The maximum number of turns (N) parameter refers to the number of coil turns that can be formed with the wire traces 54 in the PCB 51 as determined by via size, via to via clearance, and inner diameter 57. The trace maximum depth (h) parameter refers to the maximum distance between the first group 63 of wire traces and the second group 64 of wire traces (FIG. 8B), which is equivalent to the length of the vias 69.

Regarding the Rogowski coil 55 of the prior art coil PCBA 50, the voltage V induced on the Rogowski coil 55 due to time-varying current on a circuit interrupter primary conductor can be calculated using the various parameters listed in Table 1, as expressed by Equation (1):

$$V = N \times \frac{\mu_0 \times h}{2 \times \pi} \times \ln\frac{o}{i} \times \frac{dI_{primary}}{dt} \quad (1)$$

where $\mu_0$ is vacuum permeability and $$\frac{dI_{primary}}{dt}$$

is the rate of change of the current through the circuit interrupter 1. The voltage V on the prior art coil 55 can also be expressed in terms of the Rogowski coil mutual inductance M instead, as shown in Equation (2):

$$V = M\frac{dI_{primary}}{dt} \quad (2)$$

Thus, the Rogowski coil mutual inductance M for the prior art coil 55 is found by using the parameters listed in Table 1 to calculate the voltage V using Eq. (1), and then using the value of V from Eq. (1) to solve for M in Eq. (2).

An explanation of the parameters listed in Table 1 for the improved PCB coil assembly 100 will now be provided in conjunction with FIGS. 9A-9B. FIG. 9A is a reproduction of the sectional view of the improved coil assembly 100 mounted on the load bus bar 36 shown FIG. 5D, and FIG. 9B shows the sectional view of the improved coil assembly 100 shown in FIG. 9A with the load bus bar 36 omitted. Referring to the reference numbers used in FIG. 9B, the Table 1 dimension parameters (D) of width and height refer to the width 151 and height 152 of the fully assembled coil assembly 100 (as shown in FIG. 9B, the width 151 and height 152 exclude the dimensions of any portion of the snug-fit caps 134 and start lead 120 that extend from the PCBs 102 to the exterior of the coil assembly 100). The width 151 of the assembly 100 is equivalent to the width of a short board 123, and the reference number 151 may accordingly be used to refer to the width of a short board 123. Each of the long boards 122 and 124 has a height 153, and all four PCBs 102 have a thickness 155. Because the edges of the long boards 122, 124 abut the interior surfaces 111 of the short boards 123, the assembly height 152 is equal to the sum of: the height 153 of a long board 122 or 124, and the thicknesses 155 of both short boards 123.

Still referring to the parameters listed in Table 1 for the improved PCB coil assembly 100, the trace maximum depth (h) is the maximum distance between a via row 201 and a via row 202 (labeled in FIG. 6) on a given long board 122 or 124 that would achieve the Rogowski mutual inductance (M) given in Table 1. The cross-sectional area parameter (A) refers to the cross-sectional area between the winding traces 106 and 107 for each of the long boards 122 and 124. Because the inner traces 106 are formed on the interior surfaces 111 of the long boards 122, 124 and the outer traces 107 are formed on the exterior surfaces 112 of the long boards 122, 124, the cross-sectional area (A) for each long board 122 or 124 is equal to the trace maximum depth (h) multiplied by the PCB thickness 155. The total path length around the loop parameter (l) refers to the length of the loop formed by the complete wire trace Rogowski coil 110, and is computed by summing the widths 151 of both short boards 123, and the heights 153 of both long boards 122, 124. The maximum number of turns (N) parameter refers to the number of coil turns that can be formed with the wire traces 106, 107 in the PCBs 102 given the height 153 of the long boards 122, 124 and the length 151 of the short boards 123.

The mutual inductance M of the disclosed improved PCB coil assembly 100 can be calculated using the parameters listed in Table 1 in the following Equation (3):

$$M = N \times \mu_0 \times A/l \quad (3)$$

where $\mu_0$ is vacuum permeability. The voltage V induced on the wire trace coil 110 of the disclosed improved design 100 is expressed by Equation (4):

$$V = N \times \mu_0 \times \frac{A}{l} \times \frac{dI_{primary}}{dt} \quad (4)$$

In comparing the design of the prior art coil PCBA 50 shown in FIG. 4 to the design of the disclosed improved PCB coil assembly 100 in FIG. 3, as well as the attributes of the prior art coil PCBA 50 and the attributes of the disclosed improved coil assembly 100 listed in Table 1, it is readily apparent that the disclosed improved PCB coil assembly 100 offers a much more economical use of space within the circuit interrupter 1 than prior art coil PBAs do, without any sacrifices in current-sensing ability. In particular, it is noted that the two long boards 122, 124 comprise the majority of the surface area of the improved PCB coil assembly 100, and that this majority of the surface area of the improved assembly 100 is disposed parallel to the first section 43 of the service return portion 39 of the load bus bar 36 (the first section 43 being numbered in FIGS. 3 and 5A). This results in the lengths 116 of the wire traces 106 and 107 that form the turns of the wire trace coil 110 being disposed parallel to the flow of current i(t). In contrast, the first and second circular surfaces 60, 61 comprise the majority of the surface area of the prior art coil PCBA 50, and it is noted that this majority of the surface area of the prior art coil PCBA 50 is disposed perpendicularly to the first section 43 of the service return portion 39 of the load bus bar 36. This results in the lengths 73 of the wire traces 63 and 64 that form the turns of the prior art wire trace coil 55 being disposed perpendicularly to the flow of current i(t).

While specific embodiments of the invention have been described in detail, it will be appreciated by those skilled in the art that various modifications and alternates to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A coil assembly for sensing current through a bus bar, the coil assembly comprising:
   a pre-assembled portion constituting less than the entirety of the coil assembly, the pre-assembled portion comprising:
      a plurality of pre-coupled printed circuit boards, PCBs, fixedly coupled to one another, each of the pre-coupled PCBs comprising a first plurality of wire traces;
   a removable portion structured to be coupled to the pre-assembled portion, the removable portion comprising:
      a removable printed circuit board, PCB, comprising a second plurality of wire traces; and
   a plurality of connectors structured to couple the removable portion to the pre-assembled portion,
   wherein the pre-assembled portion is structured to be mounted to the bus bar prior to the removable portion being coupled to the pre-assembled portion,
   wherein the pre-assembled portion and the removable portion are structured such that coupling the removable portion to the pre-assembled portion forms a complete wire trace Rogowski coil structured to surround a flow of current through the bus bar, the wire trace Rogowski coil being formed by the first plurality of wire traces and the second plurality of wire traces, and
   with respect to a section of the bus bar to which the coil assembly is structured to be mounted, the coil assembly is structured such that, when the coil assembly is mounted to the bus bar, a majority of the surface area of the coil assembly is disposed parallel to the section of the bus bar and faces the section of the bus bar.

2. The coil assembly of claim 1,
   wherein the pre-assembled portion and the removable portion are structured such that coupling the removable portion to the pre-assembled portion forms an open rectangular prism.

3. The coil assembly of claim 1,
   wherein the pre-assembled portion comprises three pre-coupled PCBs,
   wherein two of the pre-coupled PCBs are disposed parallel to one another and form a first parallel PCB pair, such that a remaining pre-coupled PCB is not in the first parallel PCB pair,
   wherein the remaining pre-coupled PCB is disposed perpendicularly to both of the pre-coupled PCBs in the first parallel PCB pair,
   wherein the pre-assembled portion is structured such that coupling the removable portion to the pre-assembled portion results in the removable PCB being disposed perpendicularly to both of the pre-coupled PCBs in the first parallel PCB pair and being disposed parallel to the remaining pre-coupled PCB, such that the removable PCB and the remaining pre-coupled PCB form a second parallel PCB pair.

4. The coil assembly of claim 3,
   wherein the plurality of connectors comprises a plurality of snug-fit connectors, each of the snug-fit connectors comprising a first end and a second end, the first end being structured to be coupled to one of the pre-coupled PCBs,
   wherein the plurality of connectors comprises a plurality snug-fit caps structured to be coupled to the removable PCB and to receive the second ends of the snug-fit connectors,
   wherein a first one of the snug-fit connectors is coupled at its first end to a first one of the pre-coupled PCBs in the first parallel PCB pair,
   wherein a second one of the snug-fit connectors is coupled at its first end to a second one of the pre-coupled PCBs in the first parallel PCB pair,
   wherein a first one of the snug-fit caps and a second one of the snug-fit caps are coupled to the removable PCB,
   wherein the removable portion is structured to be disposed in an aligned position, the aligned position being a position in which the first one of the snug-fit caps is positioned to receive the second end of the first one of the snug-fit connectors, and in which the second one of the snug-fit caps is positioned to receive the second end of the second one of the snug-fit connectors, and
   wherein the removable portion and pre-assembled portion are structured such that pushing the removable portion toward the pre-assembled portion when the removable portion is in the aligned position couples the removable portion to the pre-assembled portion.

5. The coil assembly of claim 3,
   wherein the two pre-coupled PCBs in the first parallel PCB pair have the same dimensions as each other,
   wherein the remaining pre-coupled PCB is longer than the two pre-coupled PCBs in the first parallel PCB pair.

6. The coil assembly of claim 5,
   wherein the removable PCB has the same dimensions as the remaining pre-coupled PCB.

7. The coil assembly of claim 6,
wherein a length of the two pre-coupled PCBs in the first parallel PCB pair is equivalent to a width of the remaining pre-coupled PCB and a width of the removable PCB.

8. The coil assembly of claim 1,
wherein a width of the wire trace Rogowski coil does not exceed 18.5 millimeters.

9. The coil assembly of claim 1,
wherein a width of the coil assembly is 13.22 millimeters or less, and
wherein a height of the coil assembly is 64.02 millimeters or less.

10. The coil assembly of claim 1,
wherein the wire trace Rogowski coil comprises a plurality of turns,
wherein the plurality of turns are formed by a first subset of wire traces from the first plurality of wire traces and a second subset of wire traces from the second plurality of wire traces,
wherein the coil assembly is structured such that, when the coil assembly is mounted to the bus bar, a length of each wire in the first subset of wire traces and a length of each wire in the second subset of wire traces is disposed parallel to flow of current.

* * * * *